United States Patent
Han (10) Patent No.: US 6,891,763 B1
(45) Date of Patent: May 10, 2005

(54) INPUT BUFFER WITH DIFFERENTIAL AMPLIFIER

(75) Inventor: Jonghee Han, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/744,804

(22) Filed: Dec. 23, 2003

(51) Int. Cl.$^7$ .................................................. G11C 7/00
(52) U.S. Cl. .............................. 365/189.05; 365/230.08
(58) Field of Search ..................... 365/189.05, 230.08, 365/185.21, 210

(56) References Cited

U.S. PATENT DOCUMENTS

| | | | | |
|---|---|---|---|---|
| 4,858,191 A | * | 8/1989 | Higuchi et al. | 365/189.05 |
| 5,216,295 A | * | 6/1993 | Hoang | 326/115 |
| 6,002,618 A | * | 12/1999 | Komarek et al. | 365/189.05 |
| 6,256,234 B1 | | 7/2001 | Keeth et al. | 365/189.05 |
| 6,424,590 B1 | | 7/2002 | Taruishi et al. | 365/230.08 |
| 6,480,039 B1 | | 11/2002 | Feurle | 327/74 |
| 6,807,108 B2 | * | 10/2004 | Maruyama et al. | 365/189.05 |

* cited by examiner

Primary Examiner—Gene N. Auduong
(74) Attorney, Agent, or Firm—Dicke, Billig & Czaja, PLLC (57) ABSTRACT

Embodiments of the present invention are illustrated in a random access memory. In one embodiment, a random access memory comprises an array of memory cells, a write circuit, and an input buffer configured to receive data and pass the received data to the write circuit that writes the received data into the array of memory cells. The input buffer comprises a differential amplifier configured to receive the data and in response to the received data supply a first signal and a second signal that is the compliment of the first signal. The input buffer also comprises a first transistor configured to be controlled by the first signal and a second transistor configured to be controlled by the second signal. The first transistor and the second transistor are turned on to provide a current path through the first transistor and the second transistor to change the first signal in response to a transition in the received data.

32 Claims, 3 Drawing Sheets

# INPUT BUFFER WITH DIFFERENTIAL AMPLIFIER

BACKGROUND

One type of memory known in the art is double data rate synchronous dynamic random access memory (DDR SDRAM). In general, DDR SDRAM includes at least one array of memory cells. The memory cells in the array of memory cells are arranged in rows and columns, with the rows extending along an x-direction and the columns extending along a y-direction. Conductive word lines extend across the array of memory cells along the x-direction and conductive bit lines extend across the array of memory cells along the y-direction. A memory cell is located at each cross point of a word line and a bit line. Memory cells are accessed using a row address and a column address.

DDR SDRAM uses a main clock signal and data strobe (DQS) signals for executing commands within the memory. The clock signal is used as a reference for the timing of commands, such as read and write commands. DQS signals are used as references for latching input data into the memory and output data into an external device.

During a write operation, two bits, four bits, or another even number of bits are collected and processed in the memory at the same time to maximize the bandwidth of the memory. An input DQS signal and input data bits are supplied by an external device. The input data bits are collected by the memory on each transition of the input DQS signal. The data bits are typically center aligned with the rising and falling edges of the DQS signal for latching the data into the memory. At the first clock signal rising edge after the final DQS signal falling edge, the collection of data bits ends and internal processing begins.

As data communication frequencies increase, center aligning input data bits with the input DQS signal rising and falling edges inside the memory becomes increasingly difficult. Input buffers can have different output rise and fall times that lead to different propagation delays for low to high voltage level and high to low voltage level transitions. This mismatch in propagation delays results in mismatched setup and hold times or an increase in setup and hold times and slower data communication frequencies.

SUMMARY

Embodiments of the present invention are illustrated in a random access memory. In one embodiment, a random access memory comprises an array of memory cells, a write circuit, and an input buffer configured to receive data and pass the received data to the write circuit that writes the received data into the array of memory cells. The input buffer comprises a differential amplifier configured to receive the data and in response to the received data supply a first signal and a second signal that is the compliment of the first signal. The input buffer also comprises a first transistor configured to be controlled by the first signal and a second transistor configured to be controlled by the second signal. The first transistor and the second transistor are turned on to provide a current path through the first transistor and the second transistor to change the first signal in response to a transition in the received data.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
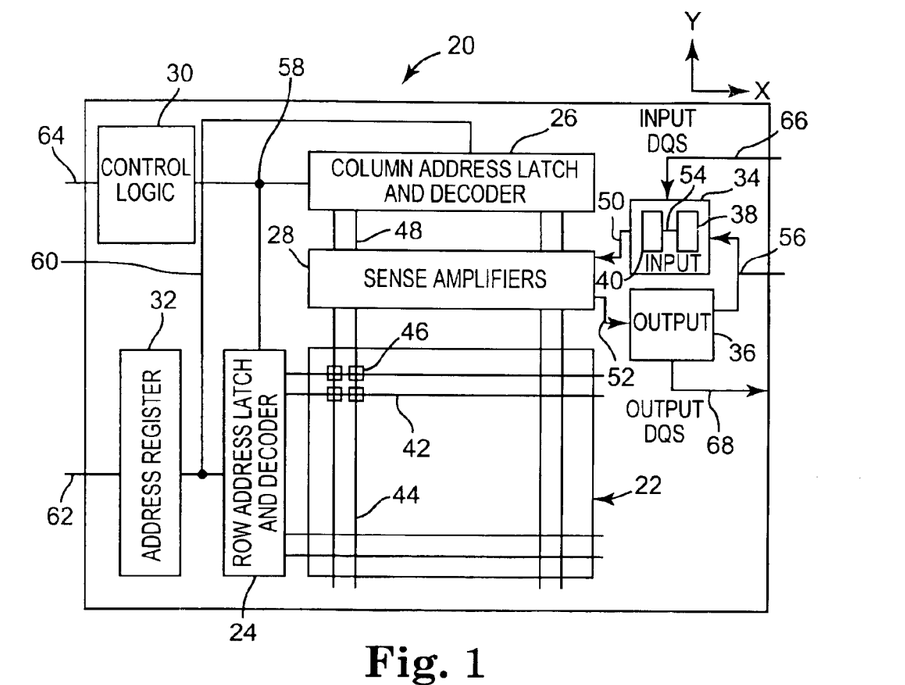
FIG. 1 is a block diagram illustrating a random access memory.

FIG. 1 is a block diagram illustrating a random access memory 20. In one embodiment, the random access memory 20 is a double data rate synchronous dynamic random access memory (DDR SDRAM). The DDR SDRAM 20 includes an array of memory cells 22, a row address latch and decoder 24, a column address latch and decoder 26, sense amplifiers 28, control logic 30, an address register 32, a data input register 34 and a data output register 36. The data input register 34 includes data input buffers 38 and data input latches 40. At least one of the data input buffers 38 includes a differential amplifier electrically coupled to a pull-up or pull-down circuit for equalizing or matching the rise and fall times of the input buffer's output signal. In one embodiment, the additional circuit is a pull-up circuit for pulling the output signal from a low voltage level to a high voltage level. In another embodiment, the additional circuit is a pull-down circuit for pulling the output signal from a high voltage level to a low voltage level.

Conductive word lines 42, referred to as row select lines, extend in the x-direction across the array of memory cells 22. Conductive bit lines 44, referred to as column select lines, extend in the y-direction across the array of memory cells 22. A memory cell 46 is located at each cross point of a word line 42 and a bit line 44. Each word line 42 is electrically coupled to row address latch and decoder 24 and each bit line 44 is electrically coupled to one of the sense amplifiers 28. The sense amplifiers 28 are electrically coupled to column address latch and decoder 26 through conductive column decoder lines 48. In addition, the sense amplifiers 28 are electrically coupled to data input register 34 and data input latches 40 through data input lines 50 and to data output register 36 through data output lines 52. The data input latches 40 are electrically coupled to data input buffers 38 through conductive data lines 54. The data input register 34 and data input buffers 38 are electrically coupled to the data output register 36 through data input/output (I/O) lines 56 that are electrically coupled to data I/O pads or pins, referred to as DQ's, to transfer data between DDR SDRAM 20 and an external device.

The control logic 30 is electrically coupled to row address latch and decoder 24 and column address latch and decoder 26 through latch control lines 58. The address register 32 is electrically coupled to row address latch and decoder 24 and column address latch and decoder 26 through row and column address lines, indicated at 60. The address register 32 receives row and column address signals through address lines 62. The control logic 30 receives control signals, such as read/write enable, row address strobe (RAS) and column address strobe (CAS) signals, through control lines 64.

The address register 32 supplies a row address to the row address latch and decoder 24 and the control logic 30 supplies the RAS signal to the row address latch and decoder 24 to latch the supplied row address into the row address latch and decoder 24. The address register 32 supplies a column address to the column address latch and decoder 26 and the control logic 30 supplies the CAS signal to the column address latch and decoder 26 to latch the supplied column address into the column address latch and decoder 26.

Data input register 34 includes a plurality of data input buffers 38 and corresponding data input latches 40 that receive and transfer data from an external device to sense amplifiers 28. The data and an input data strobe (DQS) signal, indicated at 66, are supplied by an external device to data input register 34. The data input buffers 38 receive the data and provide the data to data input latches 40. The input DQS signal 66 latches the data into the data input latches 40. Data bits are collected on each transition of input DQS signal 66. The latches 40 provide the latched data to sense amplifiers 28 that store the data into selected memory cells 46.

Data output register 36 includes a plurality of output latches that receive data read from array 22. The output data and an output DQS signal, indicated at 68, are supplied to the DQ's to be read by an external device. Data read from selected memory cells 46 appear at the DQ's once access is complete and the output is enabled. At other times, the DQ's are in a high impedance state.

During a read operation, control logic 30 receives read control signals and address register 32 receives the row address of a selected memory cell or cells 46. The row address is supplied from the address register 32 to the row address latch and decoder 24 and latched into the row address latch and decoder 24 by control logic 30 and a RAS signal. The row address latch and decoder 24 decodes the row address and activates the selected word line 42. As the selected word line 42 is activated, the value stored in each memory cell 46 that is coupled to the selected word line 42 is passed to the respective bit line 44. The value stored at each memory cell 46 is detected by a sense amplifier 28 electrically coupled to the respective bit line 44. Next, the address register 32 receives the column address of the selected memory cell or cells 46. The column address is supplied from the address register 32 to the column address latch and decoder 26 and latched into the column address latch and decoder 26 by control logic 30 and a CAS signal. The column address latch and decoder 26 decodes the column address and selects the sense amplifiers 28 that pass data to data output register 36 for retrieval by an external device.

During a write operation, data to be stored in array 22 is supplied from an external device to the DQ's and data input buffers 38. The external device can also supply the input DQS signal 66 that latches the received data into data input latches 40 on each edge of the input DQS signal 66. Control logic 30 receives write control signals and address register 32 receives the row address of a selected memory cell or cells 46 where the received data is to be written. The row address is supplied from the address register 32 to the row address latch and decoder 24 and latched into the row address latch and decoder 24 by control logic 30 and a RAS signal. The row address latch and decoder 24 decodes the row address and activates the selected word line 42. Next, the address register 32 receives the column address of the selected memory cell or cells 46 and supplies the column address to the column address latch and decoder 26. The column address is latched into the column address latch and decoder 26 by control logic 30 and a CAS signal. The column address latch and decoder 26 selects the sense amplifiers 28 that are passed data from the data input register 34. The sense amplifiers 28 write the data to the selected memory cell or cells 46 through bit lines 44.

Figure 2:
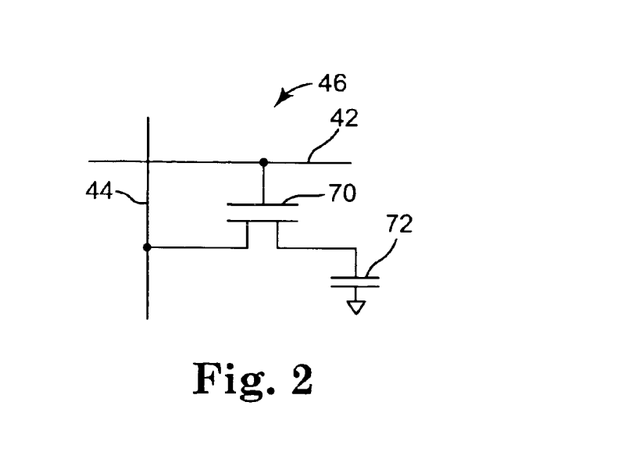
FIG. 2 is a diagram illustrating one embodiment of a memory cell in the array of memory cells.

FIG. 2 is a diagram illustrating one embodiment of a memory cell 46 in the array of memory cells 22. Memory cell 46 includes a transistor 70 and a capacitor 72. The gate of transistor 70 is electrically coupled to word line 42. One side of the drain-source path of transistor 70 is electrically coupled to bit line 44 and the other side of the drain-source path is electrically coupled to one side of capacitor 72. The other side of capacitor 72 is electrically coupled to a reference voltage, such as one-half the supply voltage. The capacitor 72 is charged and discharged to represent a logic 0 or a logic 1. During a read operation, word line 42 is activated to turn on transistor 70 and the value stored on capacitor 72 is read by a sense amplifier 28 through bit line 44. During a write operation, word line 42 is activated to turn on transistor 70 and access the capacitor 72. One of the sense amplifiers 28 writes a value on capacitor 72 through bit line 44 and transistor 70.

The read operation on memory cell 46 is a destructive read operation. After each read operation, capacitor 72 is recharged or discharged to the value that was just read. In addition, even without read operations, the charge on capacitor 72 discharges over time. To retain a stored value, memory cell 46 is refreshed periodically by reading or writing the memory cell 46. All memory cells 46 in the array of memory cells 22 are periodically refreshed to maintain their values.

In DDR SDRAM, the read and write operations are synchronized to a system clock. The system clock is supplied by a host system that includes the DDR SDRAM. DDR SDRAM operates from a differential clock, CK and bCK. The crossing of CK going high and bCK going low is referred to as the positive edge of CK. Commands such as read and write operations, are registered at the positive edge of CK. Operations are performed on both the rising and falling edges of the system clock.

The DDR SDRAM uses a double data rate architecture to achieve high speed operation. The double data rate architecture is essentially a 2n prefetch architecture with an interface designed to transfer two data words per clock cycle at the DQ's. A single read or write access for the DDR SDRAM effectively consists of a single $2n$ bit wide, one clock cycle data transfer at the internal memory array and two corresponding n bit wide, one half clock cycle data transfers at the DQ's.

An input DQS signal, such as input DQS signal 66, is supplied by an external device along with input data for latching the input data into the DDR SDRAM. The input DQS signal is center aligned with the input data that is registered on both edges of the input DQS signal. The output DQS signal, such as output DQS signal 68, is transmitted by the DDR SDRAM during read operations. The output DQS signal is edge aligned with output data for read operations. Output data is registered on both edges of the output DQS signal.

Read and write accesses to a DDR SDRAM are burst oriented. Accesses start at a selected location and continue for a programmed number of locations in a programmed sequence. Accesses can begin with the registration of an active command, which is followed by a read or write command. The address bits registered coincident with the active command are used to select the bank and row to be accessed. The address bits registered coincident with the read or write command select the bank and the starting column location for the burst access.

The DDR SDRAM in the preceding description is referred to as DDR-1 SDRAM for being the first generation of DDR SDRAM. The next generation of DDR SDRAM, DDR-II SDRAM has the same features as DDR-I SDRAM except that the data rate is doubled. The DDR-II SDRAM architecture is essentially a 4n prefetch architecture with an interface designed to transfer four data words per clock cycle at the DQ's. A single read or write access for the DDR-II SDRAM effectively consists of a single 4n bit wide, one clock cycle data transfer at the internal memory array and four corresponding n bit wide, one quarter clock cycle data transfers at the DQ's. In one embodiment, DDR SDRAM 20 is a DDR-II SDRAM.

Figure 3:
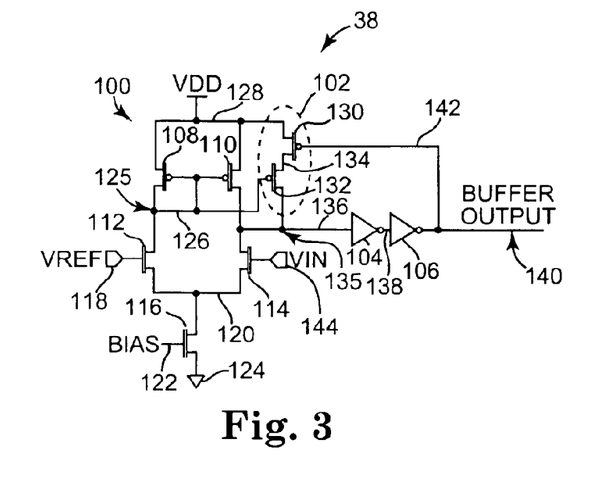
FIG. 3 is a diagram illustrating one embodiment of one of the data input buffers.

FIG. 3 is a diagram illustrating one embodiment of one of the data input buffers 38. The data input buffer 38 includes a differential amplifier, indicated at 100, a pull-up circuit 102 and two inverters 104 and 106. The data input buffer 38 is part of data input register 34 and DDR SDRAM 20. In other random access memory embodiments, input buffers, such as data input buffer 38, can be used as data input buffers, address input buffers and/or control signal input buffers. In addition, input buffers, such as data input buffer 38, can be used in circuits other than random access memories, such as controllers or digital signal processing circuits.

The differential amplifier 100 includes two p-channel metal oxide semiconductor (PMOS) transistors 108 and 110 configured as an active current mirror load and two n-channel metal oxide semi-conductor (NMOS) transistors 112 and 114 configured as a differential input transistor pair. In addition, the differential amplifier 100 includes an NMOS common source transistor 116 that is used as a current source for the differential amplifier 100.

In the differential amplifier 100, the gate of NMOS transistor 112 is electrically coupled to a voltage supply at 118. The voltage supply supplies a voltage reference signal VREF to the gate of NMOS transistor 112.

The source of NMOS transistor 112 is electrically coupled to the source of NMOS transistor 114 and the drain of NMOS transistor 116 through common source conductor 120. The gate of NMOS transistor 116 is electrically coupled to a bias voltage supply at 122 and the source of NMOS transistor 116 is electrically coupled to a reference voltage, such as ground, at 124. The bias voltage supply supplies a voltage signal BIAS to turn on NMOS transistor 116 and provide a current source for the differential amplifier 100.

The drain of NMOS transistor 112 is electrically coupled to the drain and gate of PMOS transistor 108 and the gate of PMOS transistor 110 at the non-inverting output node, indicated at 125, through the non-inverting output node conductor 126. The source of PMOS transistor 108 and the source of PMOS transistor 110 are electrically coupled to a power supply that provides power supply voltage VDD to the data input buffer 38 through power conductor 128.

The pull-up circuit 102 includes two PMOS transistors 130 and 132. The source of PMOS transistor 130 is electrically coupled to the power supply through power conductor 128 and the drain of PMOS transistor 130 is electrically coupled to the source of PMOS transistor 132 at 134. The gate of PMOS transistor 132 is electrically coupled to the non-inverting output node 125 through the non-inverting output conductor 126. The drain of PMOS transistor 132 is electrically coupled to the drain of NMOS transistor 114 and the input of inverter 104 at the inverting output node 135 through inverting output node conductor 136. The output of inverter 104 is electrically coupled to the input of inverter 106 at 138 and the output of inverter 106 is electrically coupled to the gate of PMOS transistor 130 at the buffer output 140 through buffer output conductor 142. The gate of NMOS transistor 114 receives the input signal VIN at 144, which is the input of data input buffer 38.

In operation, if the reference signal VREF is greater than the input signal VIN, NMOS transistor 112 conducts more current than NMOS transistor 114. In this situation, to simplify the description herein, NMOS transistor 112 is referred to as being switched on and NMOS transistor 114 is referred to as being switched off. With NMOS transistor 112 on, the non-inverting output node 125 is pulled to a low voltage level that turns on PMOS transistors 108, 110 and 132. PMOS transistors 108, 110 and 132 can conduct more current, referred to herein as being switched on, with non-inverting output node 125 pulled to a low voltage level as compared to the amount of current PMOS transistors 108, 110 and 132 can conduct with the non-inverting output node at a high voltage level. With NMOS transistor 114 off, the inverting output node 135 is pulled to a high voltage level and the output of inverter 106 is set to a high voltage level that turns off PMOS transistor 130.

As input signal VIN transitions to a greater voltage than reference signal VREF, NMOS transistor 114 switches on to conduct more current and NMOS transistor 112 switches off to conduct less current. Switching off NMOS transistor 112 charges the non-inverting output node 125 to a high voltage level that turns off PMOS transistors 108, 110 and 132. PMOS transistors 108, 110 and 132 can conduct less current, referred to herein as being switched off, with non-inverting output node 125 pulled to a high voltage level as compared to the amount of current PMOS transistors 108, 110 and 132 can conduct with the non-inverting output node at a low voltage level. As the non-inverting output node 125 charges to a high voltage level, the inverting output node 135 is pulled to a low voltage level through NMOS transistor 114. The high voltage level to low voltage level transition at the inverting output node 135 propagates through inverters 104 and 106 to the buffer output 140. The low voltage level at the buffer output 140 turns on PMOS transistor 130. In one embodiment, the propagation delay through inverters 104 and 106 prevents PMOS transistor 130 from being switched on while the PMOS transistor 132 is on and conducting more current, i.e., the PMOS transistor 132 is switched off to conduct less current before PMOS transistor 130 is switched on.

As input signal VIN is transitioned to a voltage level that is less than reference signal VREF, NMOS transistor 114 is switched off and NMOS transistor 112 is switched on. As NMOS transistor 112 is switched on, the non-inverting output node 125 is discharged through NMOS resistor 112 to a low voltage level that turns on PMOS transistors 108, 110 and 132. As the active current mirror load PMOS transistors 108 and 110 are turned on and as the pull-up circuit PMOS transistor 132 is switched on to conduct more current, the inverting output node 135 is charged from a low voltage level to a high voltage level. The active current mirror load provides a current path from the power supply and power supply voltage VDD through PMOS transistor 110 to charge the inverting output node 135. The pull-up circuit 102 provides a current path from the power supply and power supply voltage VDD through PMOS transistor 130 and PMOS transistor 132 to charge the inverting output node 135.

The inverting output node 135 transitions from a low voltage level to a high voltage level and the low to high transition propagates through inverters 104 and 106 to provide a low to high voltage level transition at buffer output 140. The high voltage level at buffer output 140 switches off PMOS transistor 130 to greatly reduce or stop current flow through the current path of the pull-up circuit 102. The propagation delay of the low to high transition through inverters 104 and 106 prevents PMOS transistor 130 from being switched off prior to charging the inverting output node 135 through pull-up circuit 102. The pull-up circuit 102 and PMOS transistors 130 and 132 are switched on to charge inverting output node 135 faster than if the inverting output node 135 were only charged through active current mirror load PMOS transistor 110.

Figure 4:
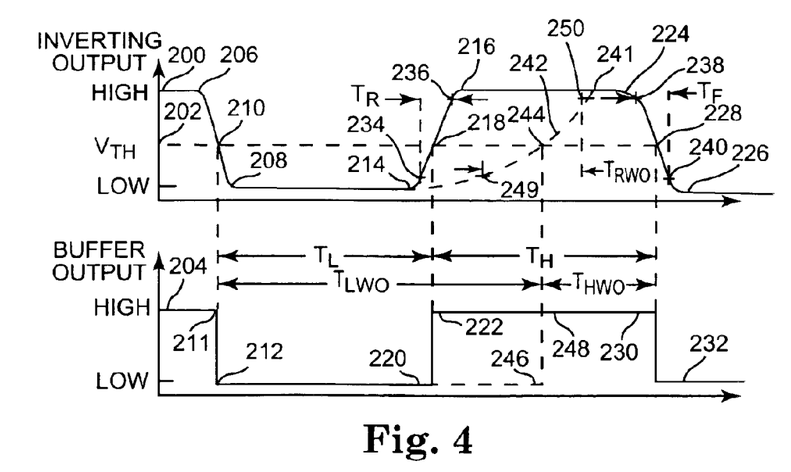
FIG. 4 is a timing diagram illustrating the voltage on the inverting output node and buffer output while switching the data input buffer.

FIG. 4 is a timing diagram illustrating the voltage on inverting output node 135 and buffer output 140 while switching the data input buffer 38. If the reference signal VREF is greater than the input signal VIN, NMOS transistor 112 is on and NMOS transistor 114 is off. The non-inverting output node 125 is pulled to a low voltage level through NMOS transistor 112 and the PMOS transistors 108, 110 and 132 are switched on. The inverting output node 135 is pulled to a high voltage level, indicated at 200. The high voltage level on inverting output node 135 is greater than the input threshold voltage $V_{TH}$ at 202 of inverter 104. The inverter 104 inverts the high voltage level signal to a low voltage level signal and passes the low voltage level signal to inverter 106. The inverter 106 provides a high voltage level, indicated at 204, on buffer output 140. The high level on buffer output 140 switches off PMOS transistor 130.

As input signal VIN transitions to a greater voltage level then reference signal VREF, NMOS transistor 112 switches off and NMOS transistor 114 switches on. The non-inverting output node 125 transitions from a low voltage level to a high voltage level and switches off PMOS transistors 108, 110 and 132. The inverting output node 135 transitions from a high voltage level at 206 to a low voltage level at 208. As the inverting output node 135 transitions past $V_{TH}$ at 210, the inverter 104 switches from a low voltage level to a high voltage level and inverter 106 switches from a high voltage level at 211 to a low voltage level at 212 on buffer output 140. The low voltage level on buffer output 140 switches on PMOS transistor 130.

As input signal VIN transitions to a voltage level that is less than reference signal VREF, NMOS transistor 112 is switched on and NMOS transistor 114 is switched off. The non-inverting output node 125 is pulled to a low voltage level through NMOS transistor 112. The low voltage level on non-inverting output node 125 switches on PMOS transistors 108, 110 and 132. Current is provided from the power supply and power supply voltage VDD through PMOS transistor 110 and through pull-up circuit PMOS transistors 130 and 132 to charge inverting output node 135. The inverting output node 135 transitions from a low voltage level at 214 to a high voltage level at 216. As the inverting output node 135 transitions past the input threshold voltage $V_{TH}$ at 218, inverter 104 switches from a high voltage level to low voltage level and inverter 106 switches from a low voltage level at 220 to a high voltage level at 222 on buffer output 140. The high voltage level at 222 on buffer output 140 switches PMOS transistor 130 off and inverting output node 135 is pulled higher through PMOS transistor 110.

As input signal VIN transitions to a greater voltage level than the voltage level of reference signal VREF, NMOS transistor 112 switches off and NMOS transistor 114 switches on to discharge the inverting output node 135 from a high voltage level at 224 to a low voltage level at 226. As the voltage level on inverting output node 135 transitions past the inverter input threshold $V_{TH}$ at 228, inverter 104 switches from a low voltage level to a high voltage level and inverter 106 switches from a high voltage level at 230 to a low voltage level at 232.

If the input signal has a 50% duty cycle, the length of time that the buffer output 140 is at a low level $T_L$ is essentially equal to the length of time that the buffer output 140 is at a high level $T_H$. In addition, the rise time $T_R$ from 10% at 234 to 90% at 236 of the voltage level on inverting output node 135 is essentially equal to the fall time $T_F$ from 90% at 238 to 10% at 240 of the voltage level on inverting output node 135.

If pull-up circuit 102 is removed from data input buffer 38, inverting output node 135 is charged through only PMOS transistor 110 from a low voltage level at 214 to a high voltage level at 241, as illustrated with dashed line 242. As the voltage on inverting output node 135 transitions past inverter input threshold $V_{TH}$ at 244, inverter 104 transitions from a high voltage level to a low voltage level and inverter 106 transitions from a low voltage level at 246 to a high voltage level at 248. The rise time without pull-up circuit $T_{RWO}$ from 10% at 249 to 90% at 250 of the voltage on inverting output node 135 is greater than the rise time $T_R$ with pull-up circuit 102 and also the fall time $T_F$, which remains essentially unchanged. In addition, even with the input signal VIN having a 50% duty cycle, the length of time that the buffer output 140 is at a low voltage level $T_{LWO}$ is greater than the length of time that the buffer output 140 is at a high voltage level $T_{HWO}$.

The data input buffer 38 including pull-up circuit 102 provides a more symmetrical output signal at inverting output node 135 and buffer output 140. The rise time $T_R$ is more closely equal to the fall time $T_F$. In addition, if the input signal VIN has a 50% duty cycle, that is if the input signal VIN provides high and low voltage level signals for the same length of time, the voltage on the buffer output 140 also provides high and low voltage level signals for essentially the same length of time. The data on buffer output 140 can be latched into data latches 40 with the center aligned input DQS signal 66 without losing data or increasing set up and hold times.

Figure 5:
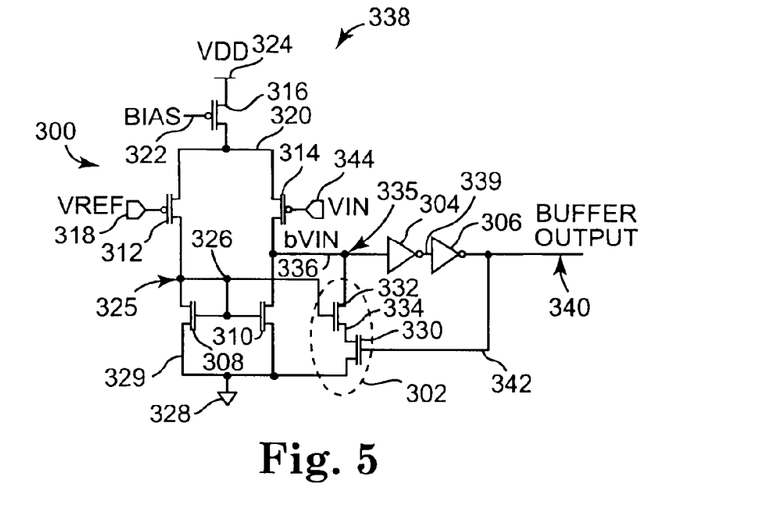
FIG. 5 is a diagram illustrating another embodiment of a data input buffer.

FIG. 5 is a diagram illustrating another embodiment of a data input buffer 338. The data input buffer 338 includes a differential amplifier, indicated at 300, a pull-down circuit 302 and two inverters 304 and 306. The data input buffer 338 can be used as part of data input register 34 and DDR SDRAM 20. In other random access memory embodiments, input buffers, such as data input buffer 338, can be used as data input buffers, address input buffers and/or control signal input buffers. In addition, input buffers, such as data input buffer 338, can be used in circuits other than random access memories, such as controllers or digital signal processing circuits.

The differential amplifier 300 includes two NMOS transistors 308 and 310 configured in an active current mirror circuit and two PMOS transistors 312 and 314 configured as a differential input transistor pair. In addition, the differential amplifier 300 includes a PMOS common source transistor 316 that is used as a current source for the differential amplifier 300.

In the differential amplifier 300, the gate of PMOS transistor 312 is electrically coupled to a voltage supply at 318. The voltage supply supplies a voltage reference signal VREF to the gate of PMOS transistor 312.

The source of PMOS transistor 312 is electrically coupled to the source of PMOS transistor 314 and the drain of PMOS transistor 316 through common source conductor 320. The gate of PMOS transistor 316 is electrically coupled to a bias voltage supply at 322 and the source of PMOS transistor 316 is electrically coupled to a power supply that supplies power supply voltage VDD at 324. The bias voltage supply provides a voltage signal BIAS to turn on PMOS transistor 316 and provide a current source for differential amplifier 300.

The drain of PMOS transistor 312 is electrically coupled to the drain and gate of NMOS transistor 308 and the gate of NMOS transistor 310 at the non-inverting output node 325 through the non-inverting output node conductor 326. The source of NMOS transistor 308 and the source of NMOS transistor 310 are electrically coupled to a reference voltage, such as ground, at 328 through reference conductor 329.

The pull-down circuit 302 includes two NMOS transistors 330 and 332. The source of NMOS transistor 330 is electrically coupled to the reference voltage at 328 through reference conductor 329 and the drain of NMOS transistor 330 is electrically coupled to the source of NMOS transistor 332 at 334. The gate of NMOS transistor 332 is electrically coupled to the non-inverting output conductor 326 and the drain of NMOS transistor 332 is electrically coupled to the drain of PMOS transistor 314, the drain of NMOS transistor 310 and the input of inverter 304 at the inverting output node 335 through inverting output node conductor 336. The output of inverter 304 is electrically coupled to the input of inverter 306 at 339. The output of inverter 306 is electrically coupled to the gate of NMOS transistor 330 at the buffer output 340 through buffer output conductor 342. The gate of PMOS transistor 314 receives the input signal VIN at 344 and is the input of data input buffer 338.

In operation, if the reference signal VREF is less than the input signal VIN, PMOS transistor 312 conducts more current than PMOS transistor 314. In this situation, to simplify the description herein, PMOS transistor 312 is referred to as being switched on and PMOS transistor 314 is referred to as being switched off. With PMOS transistor 312 on, the non-inverting output node 325 is pulled to a high voltage level that turns on NMOS transistors 308, 310 and 332. NMOS transistors 308, 310 and 332 can conduct more current, referred to herein as being switched on, with non-inverting output node 325 pulled to a high voltage level as compared to the amount of current NMOS transistors 308, 310 and 332 can conduct with the non-inverting output node at a low voltage level. With PMOS transistor 314 off, the inverting output node 335 is pulled to a low voltage level and the output of inverter 306 is set to a low voltage level that turns off NMOS transistor 330.

As input signal VIN transitions to a voltage that is less than reference signal VREF, PMOS transistor 314 is switched on and PMOS transistor 312 is switched off. Switching off PMOS transistor 312 discharges the non-inverting output node 325 to a low voltage level that switches off NMOS transistors 308, 310 and 332. NMOS transistors 308, 310 and 332 can conduct less current, referred to herein as being switched off, with non-inverting output node 325 pulled to a low voltage level as compared to the amount of current NMOS transistors 308, 310 and 332 can conduct with the non-inverting output node 325 at a high voltage level. As the non-inverting output node 325 discharges to a low voltage level, inverting output node 335 is pulled to a high voltage level through PMOS transistors 314 and 316. The low voltage level to high voltage level transition at the inverting output node 335 propagates through inverters 304 and 306 to the buffer output 340. The high voltage level at the buffer output 340 turns on NMOS transistor 330. In one embodiment, the propagation delay through inverters 304 and 306 prevents the NMOS transistor 330 from switching on while NMOS transistor 332 is on and conducting more current, i.e., the NMOS transistor 332 is switched off to conduct less current before the NMOS transistor 330 is switched on.

As input signal VIN is transitioned to a voltage level greater than reference signal VREF, PMOS transistor 314 switches off and PMOS transistor 312 switches on. As PMOS transistor 312 is switched on, the non-inverting output node 325 charges through PMOS transistor 312 and PMOS transistor 316 to a high voltage level that switches on NMOS transistors 308, 310 and 332. As the NMOS transistors 308 and 310 are switched on and as the pull-down circuit NMOS transistor 332 is switched on, the inverting output node 335 is discharged from a high voltage level to a low voltage level. The active current mirror circuit provides a current path from inverting output node 335 to the reference voltage at 328 through NMOS transistor 310 to discharge the inverting output node 335. The pull-down circuit 302 provides a current path from inverting output node 335 through NMOS transistors 330 and 332 to discharge the inverting output node 335.

The inverting output node 335 transitions from a high voltage level to a low voltage level and the high voltage level to low voltage level transition propagates through inverters 304 and 306 to provide a high voltage level to low voltage level transition at buffer output 340. The low voltage level at buffer output 340 switches off NMOS transistor 330 to greatly reduce or stop current from flowing through the current path in pull-down circuit 302. The propagation delay of the high to low voltage level transition through inverters 304 and 306 prevents the NMOS transistor 330 from switching off prior to discharging the inverting output node 335 through pull-down circuit 302. The pull-down circuit 302 including NMOS transistors 330 and 332 are switched on to discharge inverting output node 335 faster than if the inverting output node 335 were only discharged through active current mirror circuit NMOS transistor 310.

Figure 6:
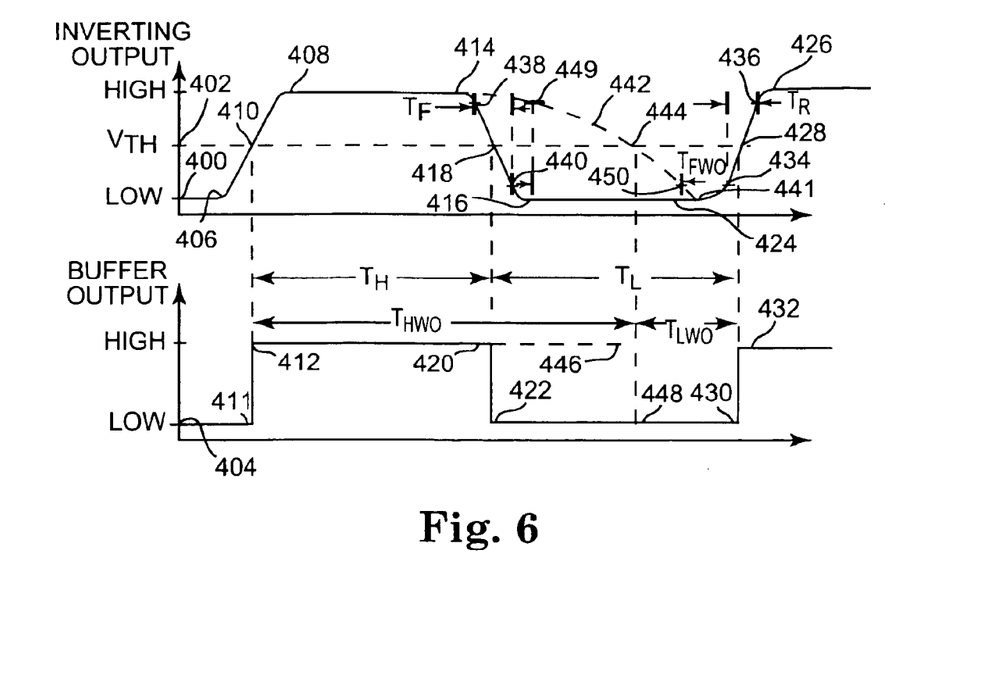
FIG. 6 is a timing diagram illustrating the voltage on the inverting output node and buffer output while switching the data input buffer.

FIG. 6 is a timing diagram illustrating the voltage on inverting output node 335 and buffer output 340 while switching the data input buffer 338. If the reference signal VREF is less than the input signal VIN, PMOS transistor 312 is on and PMOS transistor 314 is off. The non-inverting output node 325 is pulled to a high voltage level through PMOS transistors 312 and 316 to switch on the NMOS transistors 308, 310 and 332. The inverting output node 335 is pulled to a low voltage level, indicated at 400. The low voltage level on inverting output node 335 is less than the input threshold voltage $V_{TH}$ at 402 of inverter 304. The inverter 304 inverts the low voltage level to a high voltage level and passes the high voltage level signal to inverter 306. The inverter 306 provides a low voltage level signal, indicated at 404, on buffer output 340. The low voltage level on buffer output 340 switches off NMOS transistor 330.

As input signal VIN transitions to a voltage level that is less than reference signal VREF, PMOS transistor 312 switches off and PMOS transistor 314 switches on. The non-inverting output node 325 transitions from a high voltage level to a low voltage level and switches off NMOS transistors 308, 310 and 332. The inverting output node 335 transitions from a low voltage level at 406 to a high voltage level at 408. As the inverting output node 335 transitions past the input threshold voltage $V_{TH}$ at 410, inverter 304 switches from a high voltage level to a low voltage level and inverter 306 switches from a low voltage level at 411 to a high voltage level at 412 on buffer output 340. The high voltage level on buffer output 340 switches on NMOS transistor 330.

As input signal VIN transitions to a voltage level that is greater than reference signal VREF, PMOS transistor 312 is switched on and PMOS transistor 314 is switched off. The non-inverting output node 325 is pulled to a high voltage level through PMOS transistors 312 and 316. The high voltage level on non-inverting output node 325 switches on NMOS transistors 308, 310 and 332. The inverting output node 335 is discharged through NMOS transistor 310 and pull-down circuit NMOS transistors 330 and 332. The inverting output node 335 transitions from a high voltage level at 414 to a low voltage level at 416. As the inverting output node 335 transitions past the input threshold voltage $V_{TH}$ at 418, the inverter 304 switches from a low voltage level to a high voltage level and inverter 306 switches from a high voltage level at 420 to a low voltage level at 422 at buffer output 240. The low voltage level at 422 on buffer output 340 switches off NMOS transistor 330. Inverting output node 335 continues to be pulled low through NMOS transistor 310.

As input signal VIN transitions again to a voltage level that is less than the voltage level of reference signal VREF, PMOS transistor 312 switches off and PMOS transistor 314 switches on to charge the inverting output node 335 from a low voltage level at 424 to a high voltage level at 426. As the voltage level on inverting output node 335 transitions past the inverter input threshold $V_{TH}$ at 428, the inverter 304 switches from a high voltage level to a low voltage level and inverter 306 switches from a low voltage level at 430 to a high voltage level at 432.

If the input signal VIN has a 50% duty cycle, the length of time that the buffer output 340 is at a low level $T_L$ is essentially equal to the length of time that the buffer output 340 is at a high level $T_H$. In addition, the rise time $T_R$ from 10% at 434 to 90% at 436 of the voltage level on inverting output node 335 is essentially equal to the fall time $T_F$ from 90% at 438 to 10% at 440 of the voltage level on inverting output node 335.

If pull-down circuit 302 is removed from data input buffer 338, the inverting output node 335 is discharged through only NMOS transistor 310 from a high voltage level at 414 to a low voltage level at 441, as illustrated with dashed line 442. As the voltage on inverting output node 335 transitions past inverter input threshold $V_{TH}$ at 444, inverter 304 transitions from a low voltage level to a high voltage level and inverter 306 transitions from a high voltage level at 446 to a low voltage level at 448. The fall time without pull-down circuit $T_{FWO}$ from 90% at 449 to 10% at 450 of the voltage on inverting output node 335 is greater than the fall time $T_F$ with pull-down circuit 302 and also the rise time $T_R$, which remains essentially unchanged. In addition, even with the input signal VIN having a 50% duty cycle, the length of time that the buffer output 340 is at a high level $T_{HWO}$ is greater than the length of time that the buffer output 340 is at a low level $T_{LWO}$.

The data input buffer 338 including pull-down circuit 302 provides a more symmetrical output signal at inverting output node 335 and buffer output 340. The fall time $T_F$ is more closely equal to the rise time $T_R$. In addition, if the input signal VIN has a 50% duty cycle, that is if the input signal provides high voltage level and low voltage level signals for the same length of time, the voltage on the buffer output 340 also provides high voltage level and low voltage level signals for about the same length of time. The data on buffer output 340 can be strobed into the data latches 40 with the center aligned DQS signal 66 without losing data or increasing setup and hold times.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A random access memory, comprising:
   an array of memory cells;
   a write circuit;
   an input buffer configured to receive data and pass the received data to the write circuit that writes the received data into the array of memory cells, wherein the input buffer comprises:
      a differential amplifier configured to receive the data and in response to the received data supply a first signal and a second signal that is the complement of the first signal;
      a first transistor configured to be controlled by the first signal; and
      a second transistor configured to be controlled by the second signal, wherein the first transistor and the second transistor are turned on to provide a current path through the first transistor and the second transistor to change the first signal in response to a transition in the received data.

2. The random access memory of claim 1, wherein the current path is electrically coupled to a supply node to change the first signal from a low first signal to a high first signal in response to a high to low transition in the received data.

3. The random access memory of claim 1, wherein the current path is electrically coupled to a reference node to change the first signal from a high first signal to a low first signal in response to a low to high transition in the received data.

4. The random access memory of claim 1, wherein the first signal turns on the first transistor in a stable state of the differential amplifier and the second signal controls the second transistor to conduct more in response to a transition in the received data to change the first signal.

5. The random access memory of claim 1, wherein the first signal is supplied at an output node and the second transistor is electrically coupled between the first transistor and the output node.

6. The random access memory of claim 1, wherein the first signal is supplied at an output node and the first transistor is electrically coupled between the second transistor and the output node.

7. The random access memory of claim 1, wherein the first signal is supplied at an output node and the first transistor and the second transistor are PMOS transistors coupled between the output node and a supply node.

8. The random access memory of claim 1, wherein the first signal is supplied at an output node and the first transistor and the second transistor are NMOS transistors coupled between the output node and a reference node.

9. The input buffer of claim 1, wherein the differential amplifier comprises:
a differential input transistor pair; and
an active current mirror load controlled by the second signal and comprising a current mirror output electrically coupled to the output node.

10. An input buffer comprising:
a differential amplifier configured to provide a first signal at an output node and a second signal that is the complement of the first signal in a stable state of the differential amplifier;
a first transistor configured to be controlled by the first signal; and
a second transistor configured to be controlled by the second signal, wherein the first transistor is electrically coupled to the second transistor to provide a current path through the first transistor and the second transistor to the output node for changing the first signal.

11. The input buffer of claim 10, wherein the current path couples the output node to a supply node.

12. The input buffer of claim 10, wherein the current path couples the output node to a reference node.

13. The input buffer of claim 10, wherein the first transistor is configured to conduct in response to a low level first signal and the second transistor is configured to conduct in response to a low level second signal to change the low level first signal to a high level first signal.

14. The input buffer of claim 10, wherein the first transistor is configured to conduct in response to a high level first signal and the second transistor is configured to conduct in response to a high level second signal to change the high level first signal to a low level first signal.

15. The input buffer of claim 10, wherein the differential amplifier comprises:
a differential input transistor pair; and
an active current mirror load controlled by the second signal and comprising a current mirror output electrically coupled to the output node.

16. The input buffer of claim 15, wherein the differential input transistor pair and the active current mirror load are field effect transistors.

17. The input buffer of claim 15, wherein:
the differential input transistor pair are NMOS transistors;
the active current mirror load comprises PMOS transistors; and
the first transistor and the second transistor are PMOS transistors.

18. The input buffer of claim 15, wherein:
the differential input transistor pair are PMOS transistors;
the active current mirror load comprises NMOS transistors; and
the first transistor and the second transistor are NMOS transistors.

19. A memory device comprising:
means for receiving an input signal;
means for supplying a first signal in response to the input signal;
means for supplying a second signal in response to the input signal, wherein the first signal settles to the complement of the second signal; and
means for supplying a temporary current path to transition the first signal in response to an input signal transition.

20. The memory device of claim 19, wherein the means for receiving an input signal comprises one input in a differential input pair of transistors.

21. The memory device of claim 19, comprising means for receiving an input reference voltage, wherein the means for receiving an input signal comprises one input in a differential input pair of transistors and the means for receiving an input reference voltage comprises the other input of the differential input pair of transistors.

22. The memory device of claim 19, wherein the means for supplying a first signal comprises one side of a differential amplifier and the means for supplying a second signal comprises another side of the differential amplifier.

23. The memory device of claim 19, wherein the means for supplying a temporary current path comprises a first transistor configured to be controlled by the first signal and a second transistor configured to be controlled by the second signal.

24. The memory device of claim 19, wherein the means for supplying a temporary current path comprises a first transistor configured to be switched on by the first signal as the second signal transitions to control the second transistor to conduct more current and supply the temporary current path through the first transistor and the second transistor to transition the first signal and turn off the first transistor.

25. The memory device of claim 19, wherein the means for supplying a temporary current path comprises a first transistor and a second transistor electrically coupled in series between an output node and a supply node.

26. The memory device of claim 19, wherein the means for supplying a temporary current path comprises a first transistor and a second transistor electrically coupled in series between an output node and a reference node.

27. A method for transitioning an output signal of an input buffer comprising:
switching a first transistor to conduct based on the output signal;
receiving a first transition in an input signal;
transitioning a signal in response to the first transition in the input signal;
controlling a second transistor to conduct with the signal transitioned in response to the first transition in the input signal;
conducting current through the first transistor and the second transistor to transition the output signal.

28. The memory device of claim 27, comprising switching the first transistor off based on the output signal transitioned by conducting current through the first transistor and the second transistor.

29. The memory device of claim 28, wherein switching the first transistor off comprises:
delaying the transitioned output signal; and
applying the delayed transitioned output signal to switch the first transistor off.

30. The memory device of claim 27, wherein conducting current comprises conducting current from a supply node to transition the output signal from a low level to a high level.

31. The memory device of claim 27, wherein conducting current comprises conducting current into a reference node to transition the output signal from a high level to a low level.

32. The memory device of claim 27, comprising:

switching the first transistor off based on the output signal transitioned by conducting current through the first transistor and the second transistor;

receiving a second transition in the input signal;

transitioning the signal in response to the second transition in the input signal;

controlling the second transistor to conduct less current with the signal transitioned in response to the second transition in the input signal;

transitioning the output signal in response to the second transition in the input signal;

switching the first transistor on based on the output signal transitioned in response to the second transition in the input signal.

* * * * *